United States Patent [19]

Boyer et al.

[11] Patent Number: 5,473,615
[45] Date of Patent: Dec. 5, 1995

[54] DIGITAL SUPERVISORY AUDIO TONE DETECTOR

[75] Inventors: Brian E. Boyer, Alpharetta; Stephen T. Dedier, Lilburn; John F. Paulos, Roswell; Gregory S. Smith, Atlanta; Charles L. Warner, II, Stone Mountain, all of Ga.

[73] Assignee: Matsushita Communication Industrial Corporation of America, Peachtree City, Ga.

[21] Appl. No.: 33,650

[22] Filed: Mar. 17, 1993

[51] Int. Cl.⁶ .................................................. G06F 11/00
[52] U.S. Cl. .................... 371/5.1; 371/47.1; 371/42; 371/46; 375/351; 455/35.1; 455/218
[58] Field of Search ............................... 371/5.1, 5.3–5.5, 371/47.1, 42, 46; 370/105; 375/104; 340/146.2; 455/35.1, 38.1, 218, 224

[56] References Cited

U.S. PATENT DOCUMENTS

| | | | |
|---|---|---|---|
| 3,689,884 | 9/1972 | Tew, Jr. | 340/146 |
| 4,649,543 | 3/1987 | Levine | 371/41 |
| 4,876,740 | 10/1989 | Levine et al. | 455/33 |
| 4,984,290 | 1/1991 | Levine et al. | 455/33 |
| 5,187,811 | 2/1993 | Baker et al. | 371/5.1 |

*Primary Examiner*—Emanuel T. Voeltz
*Assistant Examiner*—Craig Steven Miller
*Attorney, Agent, or Firm*—Jones & Askew

[57] ABSTRACT

A detector for determining the validity of a received code, such as a Digital Supervisory Audio Tone (DSAT) code. A received DSAT code is serially shifted into a shift register (10) which outputs the received DSAT code in parallel format to a set of 24 exclusive-OR gates (12). Another shift register (11) receives a valid code, such as a valid DSAT code. The register (11) outputs the valid DSAT code, and right circular shifted (rotated) versions of the valid DSAT code, to the gates (12). The comparison signal from the gates (12) is provided to another register (13) and a counter (16) which together count the number of mismatches between the received DSAT code and the reference DSAT codes. The output of the counter (16) is provided to a comparator (17) which compares the number of mismatches against the allowable number of mismatches. The output of the comparator (17) is a validity signal (7) which indicates whether the received DSAT code matches any of the reference DSAT codes. Either the received code or the reference code may be used to provide the rotated codes.

37 Claims, 4 Drawing Sheets

DIGITAL SUPERVISORY AUDIO TONE DETECTOR

TECHNICAL FIELD

The present invention relates to mobile radiotelephones and, more particularly, describes a high speed Digital Supervisory Audio Tone (DSAT) detector.

BACKGROUND OF THE INVENTION

Many mobile radiotelephones are designed to comply with the Narrowband Advanced Mobile Phone Service (NAMPS) standard. One part of this standard specifies that a Digital Supervisory Audio Tone will be transmitted along with the voice communications so that the processor in the mobile telephone and the processor in the Mobile Telephone Switching Office (MTSO) will know that the mobile telephone is still transmitting and receiving a good signal, has not gone out of range, and is not in a blind spot. The MTSO sends a DSAT signal to the mobile telephone, and the mobile telephone sends, back to the MTSO, the same DSAT signal that it received from the MTSO. The DSAT code is a 24 bit code, transmitted continuously at the rate of 200 NRZ bits per second (bps). Control information (instructions, requests, acknowledgements) is also sent at 200 NRZ bps or by Manchester encoding at 100 bps, and preempts the transmission of any DSAT signal. As long as a valid DSAT code is being received the processor knows that the communications are still good. If the received code is invalid—or does not exist for a predetermined period of time—then it is highly likely that communications have been disrupted and therefore the audio output of the mobile telephone should be muted, and the processors in the mobile telephone and the switching office should attempt to re-establish communications, possibly on a different channel or in a different service cell.

There is no convenient way of determining whether the first received bit is the first bit in the pattern, the last bit in the pattern, or somewhere in between. However, the pattern must be detected as soon as possible. If a valid DSAT pattern is not detected for a predetermined length of time then the processors will determine that the communications are no longer good, muting of the audio output will occur and the processors will attempt to reestablish communications on a different channel. Due to noise, there will be errors in the received signal. However, the DSAT code must still be detected even if some errors are present in the received signal. Otherwise, even minor noise or errors could repeatedly disrupt communications.

If a valid DSAT code is detected the audio output of the mobile radiotelephone will be enabled, but if the received DSAT code is not valid then the audio output of the radiotelephone will be disabled. The received DSAT code must be checked very rapidly to determine its validity so that the muting can be quickly released, or else the beginning of a spoken word will be cut off, and so that muting can be quickly applied, so that the listener will not hear noise for an excessive duration. Therefore, the validity of a received DSAT code must be determined within 175 milliseconds, which is 35 bit times, even when the input data stream may have a 3% bit error rate and the precise position of the start bit in the received DSAT code is not known. Furthermore, once a received DSAT code has been determined to be valid, it should not be declared invalid even if the bit error rate increases up to 10%. However, an invalid DSAT code should not be declared valid.

Therefore, there is a need for a DSAT code detector which can rapidly detect a valid DSAT code.

Furthermore, there is a need for a DSAT code detector which can tolerate a predetermined number of errors in the received DSAT code without declaring that the received DSAT code is invalid.

SUMMARY OF THE INVENTION

The present invention provides a method and apparatus for rapidly checking a first code, such as a received DSAT code, to determine if the code is a valid code, even when there are bit errors in the received code. Because there may be no convenient way of determining exactly where the start bit of a code is located in the received data stream, the present invention does not attempt to locate the start bit. Instead, if the code is a repeating code, such as a DSAT code, the present invention compares the received code, without being concerned about the location of the start bit, with all the possible rotations of the valid code. If the received code matches any rotation of the valid code then the received code is deemed to be a valid code. In addition, the present invention tolerates a selectable number of mismatches between the received code and the valid code.

More particularly described, the present invention comprises a first device, such as a shift register, for receiving an input data stream and providing a 24 bit received DSAT code, a second device, such as another shift register, for receiving a valid DSAT code and providing the valid DSAT code and also providing the 23 rotations of the valid DSAT code by fight circular shifting (rotating) the valid DSAT code one bit at a time, a third device, such as a set of exclusive-OR gates, for comparing the received DSAT code with the valid and rotated DSAT codes provided by the second device, and a fourth device, such as a counter and a comparator, for comparing the number of mismatches with an allowed number of mismatches, which may be a predetermined value, and providing a signal which indicates the validity or invalidity of the received DSAT code. The present invention provides that, for each new bit received, the received DSAT code will be compared against all of the reference (valid and rotated) DSAT codes to determine if the received DSAT code matches, within the allowable number of errors, any of the reference DSAT codes. Therefore, the present invention does not attempt to determine the location of the starting bit in the received DSAT code but, instead, treats the received DSAT code as being a rotated DSAT code and proceeds to determine if the received DSAT code matches any valid or rotated valid DSAT code.

In an alternative embodiment, the present invention provides for rotating the received DSAT code one bit at a time and comparing each rotation of the received DSAT code with the valid DSAT code to determine if the rotated received DSAT code matches the valid DSAT code within an allowable number of errors. This embodiment is similar to the preferred embodiment but, instead of rotating the valid DSAT code, rotates the received DSAT code.

In another embodiment of the present invention, the received DSAT code is simultaneously compared against the valid DSAT code and the rotated versions thereof. A first device, such as a shift register, receives the input data stream to provide the received DSAT code, a second device, such as a shift register, provides the valid DSAT code, a plurality of third devices, such as sets of exclusive-OR gates, so that each set of gates provides a comparison of the received DSAT signal with a different version of the valid DSAT signal, each set of gates being connected differently to the output of the second device, a plurality of counter devices for determining the number of mismatches for each comparison, and a logic device, such as an OR-gate for providing a signal which indicates whether the received DSAT code matches the valid DSAT code or any rotated version thereof.

In still another alternative embodiment, the present invention contemplates simultaneously comparing the valid DSAT code with the received DSAT code and all possible rotations of the received code. This is similar to the alternative embodiment described above but, in the third device, all the connections from the third device to the second device are the same, but the connections from the third device to the first device are different so that each set of gates is receiving a different rotated received DSAT code.

The present invention also contemplates implementation in a microprocessor, whereby the microprocessor would execute a program comprising the steps of receiving an input data stream to provide a received DSAT code, providing a plurality of referenced DSAT codes, the referenced DSAT codes comprising a valid DSAT code and the rotated versions thereof, comparing the received DSAT code with each of the referenced DSAT codes, comparing the number of mismatches for each comparison to a predetermined value representing the maximum allowable number of errors, and providing a signal indicating the validity or invalidity of the received DSAT code based upon the number of mismatches. In this process, the received DSAT code is compared with a first referenced DSAT code, a comparison is made, the number of mismatches is determined, and a determination is made as to the validity or invalidity of the received DSAT code. If the received DSAT code is invalid then the received DSAT code is compared with a first rotated version of the valid DSAT code, then with a second rotated version of the valid DSAT code, and so forth, until a match is found between the received DSAT code and a particular rotated valid DSAT code, in which case the received DSAT code is declared to be valid, or until all possible rotations of the valid DSAT code have been compared with the received DSAT code, in which case the received DSAT code is declared to be invalid.

In an alternative embodiment of this process, the valid DSAT code is not rotated but, instead, the received DSAT code is rotated and compared with the valid DSAT code. As in the process above, if the received DSAT code or any rotated version thereof matches the valid DSAT code then the received DSAT code is declared to be valid, but if neither the received DSAT code, nor any rotated version thereof, matches the valid DSAT code then the received DSAT code is declared to be invalid.

Viewed broadly, the present invention provides an apparatus for detecting a Digital Supervisory Audio Tone (DSAT) code, comprising first means, such as a first register, for providing a first DSAT code, second means, such as a second register, for providing a plurality of DSAT codes, the plurality of DSAT codes comprising a second DSAT code and a rotated second DSAT code, wherein the first DSAT code is a selected one of either a received DSAT code contained in an input data stream or a reference DS AT code, and the second DS AT code is the non-selected one of the received DSAT code and the reference DSAT code, third means, such as a comparator, for comparing the first DSAT code with the plurality of DSAT codes to provide a comparison signal, and fourth means responsive to the comparison signal for providing a validity signal for the received DSAT code. Either the received DSAT code or the reference DSAT code may be rotated to provide for a full comparison between the two codes. Further, the comparison may be made by comparing one rotated version at a time or by comparing all rotated versions at one time. Depending upon the particular embodiment selected, the fourth means may be implemented in different ways. For example, the fourth means may comprise a register for loading and shifting the comparison signal, a counter for counting the number of differences present in the comparison signal, and a comparator for comparing the number of differences with an allowable number of differences. The fourth means may also comprise a register for loading and shifting the comparison signal, a counter for counting the number of differences present in the comparison signal, and a gate responsive to the number of differences. Although reference is made throughout to the number of differences, the present invention should also be understood as being responsive to the number of similarities.

The present invention provides for using a controller to cause the second register to provide a first one of the plurality of DSAT codes to the first comparator, and further to examine the validity signal, and, if the validity signal indicates that the second DSAT code does not match the first one of the plurality of DSAT codes then the controller further causes the second register to provide a second one of the plurality of DSAT codes to the first comparator.

The present invention therefore provides a method and apparatus for rapidly determining whether a received DSAT code is valid or invalid, within an allowable number of errors, without attempting to determine the location of the starting bit of the received DSAT code and regardless of the actual location of the starting bit of the received DSAT code.

DETAILED DESCRIPTION

Figure 1:
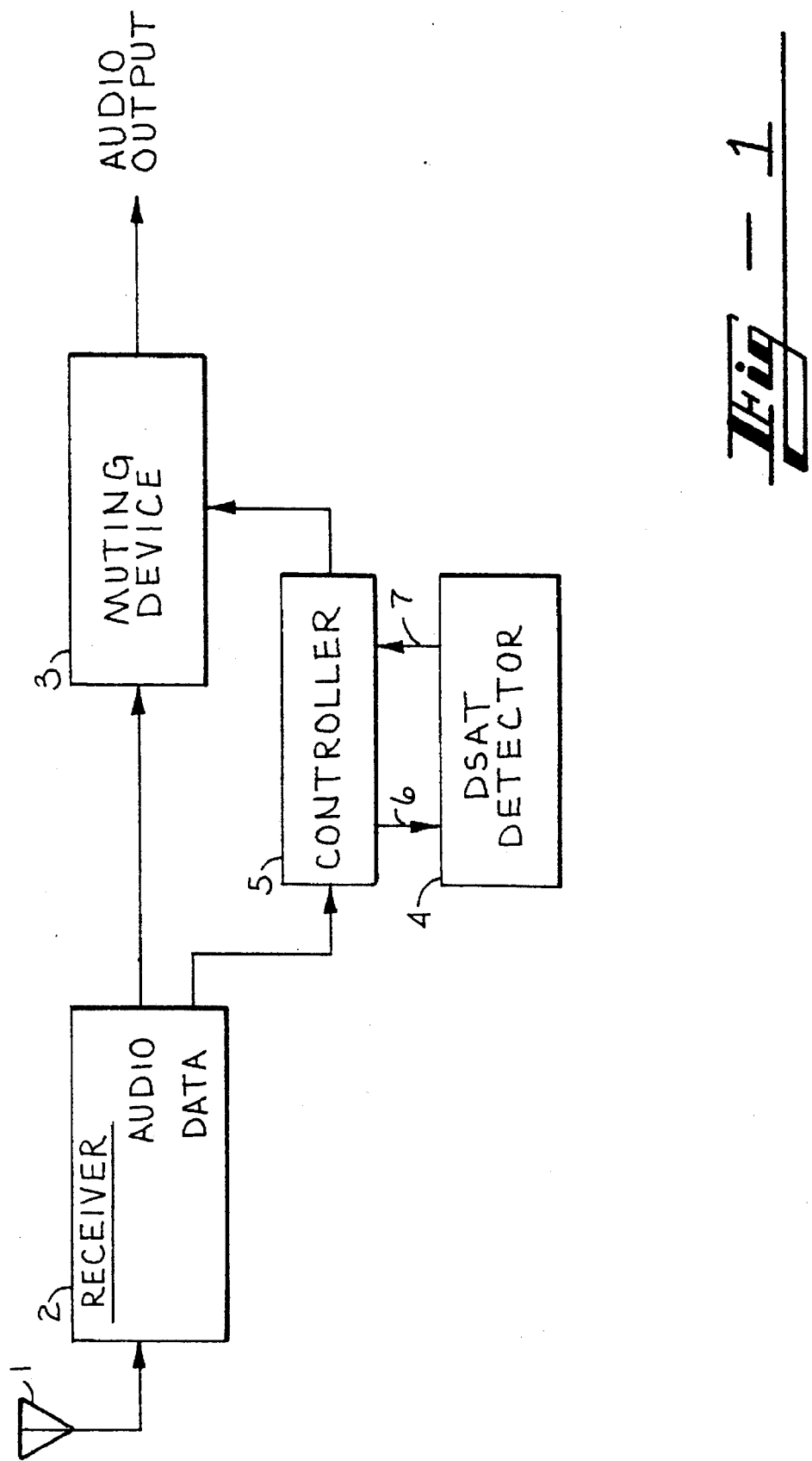
FIG. 1 s a block diagram of the preferred environment of the present invention, which is in the receiver section of a mobile radiotelephone.

Turn now to the drawing in which like numerals represent like components throughout the several figures. FIG. 1 is a block diagram of the preferred environment of the present invention, which is in the receiver section of a mobile radiotelephone. The design and construction of the transmitter section (not shown) are well known and are not described herein. An antenna 1 captures radio frequency signals transmitted by the Mobile Telephone Switching Office (MTSO) (not shown) and provides these received signals to a receiver 2 which amplifies and demodulates these received signals to provide an audio output and a digital data stream output. The audio output is provided to a muting device 3 so that the audio output may be selectively provided to a destination device (not shown) such as a handset, earphone, or speaker. The audio output is muted (squelched) by muting device 3 whenever there is no ongoing communication and whenever the ongoing communication is disrupted, such as by a low signal level, for more than a predetermined time.

The digital data stream output is provided to a radiotelephone controller 5. Controller 5 contains a phase locked loop which locks onto the digital data stream output provided by receiver 2 and then provides the phase locked digital stream as the input digital data stream to the DSAT detector 4. Controller 5 also provides a valid, reference DSAT code, shift signals, clock signals, load signals and error value signals to DSAT detector 4. The signals are collectively shown as signal 6. DSAT detector 4 analyzes the input digital data stream from controller 5 to determine whether the input data stream contains a valid DSAT code, and provides a validity signal 7, which specifies whether the received DSAT code is valid, to controller 5. If the received DSAT code is valid, then controller 5 will allow the audio output to pass through muting device 3. If the received DSAT code is invalid for a specified length of time then controller 5 will cause muting device 3 to mute the audio output. Controller 5 also analyzes the data stream to determine whether the data stream contains instructions, such as an instruction to switch to another channel, increase power, decrease power, etc. The data stream may contain instructions to controller 5 when audio communications have not yet been enabled, after audio communications have been disabled, or during audio communications by the instruction being transmitted, instead of the DSAT signal, by the MTSO. The transmission of the instruction may interrupt the transmission of the DSAT signal for a short period of time without interrupting the audio communications because controller 5 will inspect the incoming data stream to determine if a SYNC signal has been received. The SYNC signal indicates that a data message is coming from the MTSO. The controller then counts the number of incoming bits to determine when the DSAT code should resume. The protocol provides for 30 bits for the SYNC signal and 40 bits for the data. Controller 5 will cause muting device 3 to mute the audio output if the SYNC signal is not detected within 30 bits after the DSAT signal is not detected.

Figure 2:
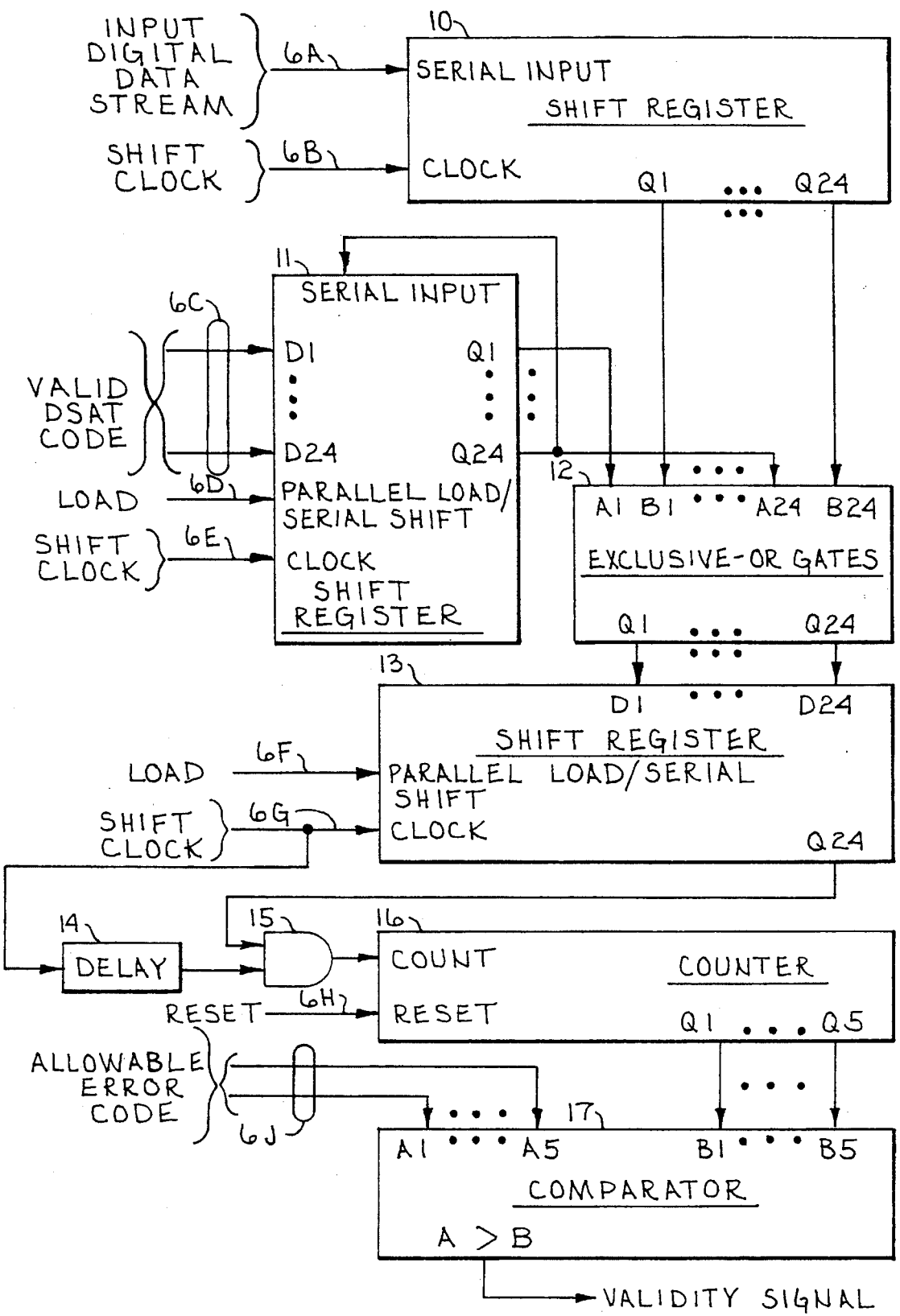
FIG. 2 is a block diagram of the preferred embodiment of the DS AT detector of the present invention.

FIG. 2 is a block diagram of the preferred embodiment of the DSAT detector 4 of the present invention. DSAT detector 4 has a shift register 10 for receiving the input data stream 6A, a shift register 11 for receiving the valid, or reference, 24 bit DSAT code, and rotated versions thereof, a set of 24 exclusive-OR gates 12 to compare the received DSAT code with the reference DSAT codes, a shift register 13 for changing the comparison signal output of gates 12 from a parallel data format to a serial data format, a counter 14 for receiving the serial data format comparison signal and counting the number of differences between the received DSAT code and the reference DSAT code (or, equivalently, counting the number of similarities between the received DSAT code and the reference DSAT code), and a comparator 15 for providing the validity signal 7 by comparing the number of differences with a predetermined value which represents the maximum allowable number of differences (or, equivalently, comparing the number of similarities with a predetermined value which represents the minimum allowable number of similarities).

The digital data stream output of controller 5 is provided as the input data stream 6A to 24-bit shift register 10. Controller 5 provides, to the clock input of register 10, a SHIFT CLOCK signal 6B which has a frequency of 200 shifts per second corresponding to the 200 bit per second data rate for the transmission of the DSAT code, and which is phase locked to the digital data stream output provided by receiver 2. As each bit in the input data stream is received, controller 5 causes shift register 10 to perform a right shift operation (shifting from Q1 toward Q24). Therefore, after a bit is received, it first appears at the Q1 output of register 10, then at the Q2 output, and so forth, until it appears at the Q24 output, and then disappears. Shift register 10 therefore performs the function of converting the input data stream, which is received in a serial data format, into a received DSAT code, which is provided in a parallel data format.

The received DSAT code is therefore present at output Q1–Q24, with the most recently received bit being at the Q1 output, and with the precise position of the first bit of the DSAT code being unknown. The Q1–Q24 outputs of register 10 are provided to the B1–B24 inputs of gates 12. There is one exclusive-OR gate for each of the 24 bits of the received DSAT code.

Controller 5, which has a valid DSAT code stored in its memory, sends this valid DSAT code 6C to the parallel data inputs D1–D24 of shift register 11 and then sends a LOAD signal 6D to the parallel load input of register 11, thereby causing register 11 to load and store the valid DSAT code. This valid DSAT code then appears at outputs Q1–Q24 of register 11. The Q1–Q24 outputs of register 11 are provided to the A1–A24 inputs of gates 12. The gates 12 perform a bit-by-bit comparison of the received DSAT code present at the output of register 10 with the valid or reference DSAT code present at the output of register 11. The 24-bit output Q1–Q24 of gates 12 provide a logic 1 for each bit where there is a difference between the received DSAT code and the reference DSAT code, and a logic 0 for each bit where the received DSAT code matches the reference DSAT code. The output of gates 12 therefore represents the number of differences between the received DSAT code and the reference DSAT code or, viewed another way, represents the number of matches or similarities between the received DSAT code and the reference DSAT code. The Q1–Q24 outputs of gates 12 are provided to the D1–D24 inputs of the 24 bit shift register 13. Each time that controller 5 causes a new bit to be shifted into shift register 10, controller 5 will also send a one pulse shift clock signal 6E to register 11. Controller 5 will then wait for a time sufficient to allow the outputs of gates 12 to become stable. The actual waiting time depends upon the logic type used to implement the invention and may range from a few nanoseconds to tens of nanoseconds. After this waiting period is over controller 5 sends a reset signal 6H to counter 16 and sends LOAD signal 6F to register 13, thereby causing register 13 to parallel load the information present at its D1–D24 inputs. Once this parallel load operation has been completed controller 5 removes load signal 6F, thereby causing register 13 to operate in a serial shift mode. Controller 5 then applies 24 pulses of a 480 kilohertz shift clock 6G to the clock input of register 13 and to delay circuit 14. Shift clock signal 6G causes the data in register 13 to be right shifted and appear, in serial data format, at the Q24 output of register 13. The Q24 output of register 13 is connected to one input of AND gate 15, and the output of delay circuit 14 is connected to the other input of AND gate 15. It will be appreciated that if register 13 contains consecutive logic 1 bits then output 24 will show a rising edge when the first logic 1 bit appears but will not show a rising edge for any other logic 1 until there is an intervening logic 0. This would not provide an accurate representation of the number of logic 1 bits. Therefore, output Q24 of register 13 is combined (logical AND) with the delayed version of shift clock signal 6G to guarantee that there will be a rising edge present at the count input of counter 16 each time that a logic 1 is present at the Q24 output of register 13. The purpose of delay circuit 14 is to allow the Q24 output of register 13 to become stable before the shift clock 6G is combined (logical AND) with the Q24 output. The precise delay will depend upon the logic used to implement the invention but the delay in the preferred embodiment is approximately 250 nanoseconds. The output of AND-gate 15 is connected to the COUNT input of 5-bit counter 16. Counter 16 increments its count each time a rising edge appears at its COUNT input. As previously stated, controller 5 sends the reset 6H signal to counter 16 to reset counter 16 before controller 5 begins sending shift clock signal 6G to register 13. Therefore, counter 16 always starts in a known condition.

Counter 16 counts the number of rising edges, which corresponds to the number of differences between the received DSAT code and the reference DSAT code. There are 24 bits in a DSAT code and therefore 5 bits are required to represent the maximum number of errors (24) that could possibly occur. The Q1–Q5 outputs of counter 16 are provided to the B1–B5 inputs of a 5 bit comparator 17. Controller 5 also provides a 5 bit maximum allowable error code signal 6J to the A1–A5 inputs of comparator 17. The "A>B" output of comparator 17 is the DSAT validity signal 7 which is provided to controller 5. If the number of errors (B1–B5) is less than the maximum allowable number of errors (A1–A5) then comparator 17 will place a logic 1 on DSAT validity signal 7 to indicate that the received DSAT is a valid DSAT. If the number of errors is greater than or equal to the maximum allowable number of errors then comparator 17 will place a logic 0 on DSAT validity signal 7, thereby indicating that the received DSAT signal is not valid. Controller 5 then inspects the DSAT validity signal 7 to determine whether action should be taken, such as enabling or disabling muting, etc.

The received DSAT code is treated as a valid DSAT code if the error rate is less than 10 percent. Ten percent of 24 errors is 2.4 errors, rounded upward to 3 errors for convenience. The lower two bits Q4 and Q5 represent a value of 0 to 3 errors. If the number of errors is greater than 3 then at least one of the higher bits Q1–Q3 will be a logic one. Therefore, in one alternative embodiment, it is only necessary to test the three higher bits Q1–Q3 to determine if the received DSAT code is valid. If any one of bits Q1–Q3 is high then the error rate is excessive and the received DSAT code is declared invalid. In this alternative embodiment the Q1–Q3 outputs of counter 16 are provided to the B1–B3 inputs of a 3 bit comparator 17 and controller 5 provides a 3 bit maximum allowable error code signal 6J to the A1–A3 inputs of comparator 17. The "A>B" output of comparator 17 is the DSAT validity signal 7 which is provided to controller 5. If the number of errors (B1–B3) is less than the maximum allowable number of errors (A1–A3) then comparator 17 will place a logic 1 on DSAT validity signal 7 to indicate that the received DSAT is a valid DSAT. In still another alternative embodiment, if the ability to adjust the number of allowable errors is not desired, then the inputs to comparator 17 may be fixed. Further, if only bits Q1–Q3 are used and the presence of a logic 1 on any of these bits indicates an excessive error rate, then comparator 17 may be replaced by a three-input OR-gate (not shown).

If the DSAT validity signal 7 indicates that the received DSAT does not match the referenced DSAT then controller 5 will cause a right circular shifted (rotated) reference DSAT code to be applied. Note that the Q24 output of register 11 is connected to the serial input of register 11. Therefore, once a valid DSAT code is loaded into register 11 controller 5 may apply shift clock signal 6E to the clock input of register 11, thereby causing the DSAT code in register 11 to be right circular shifted (rotated) within register 11 so that register 11 provides a rotated reference DSAT code at outputs Q1–Q24. After controller 5 has applied a shift clock signal pulse 6E to the clock input of register 11 controller 5 will cause register 13 to load and shift the comparison signal from gates 12, cause counter 16 to count the number of differences from register 13, and then inspect the DSAT validity signal 7 output from comparator 17. If the DSAT validity 7 indicates that the received DSAT code is not a valid DSAT code then controller 5 will apply a next shift clock pulse 6E to register 11, thereby rotating the reference DSAT code in register 11 by one bit, and repeat the above ending with the inspection of DSAT validity signal 7.

If DSAT validity signal 7 indicates that the received DSAT code is a valid DSAT code then controller 5 will switch from a search mode to a maintenance mode. The search mode, which is the mode described above, is the mode wherein controller 5 is determining whether the received DSAT code matches the reference DSAT code or any rotated reference DSAT code. In the maintenance mode, each time a new bit appears at the input digital data stream controller 5 will apply a single shift clock pulse 6E to register 11. This procedure synchronizes registers 10 and 11 so that as the received DSAT code is being right shifted through register 10 as new bits arrive the valid DSAT code is being rotated through register 11. Therefore, unless additional errors appear at the input of the digital data stream 6A, the DSAT code in register 10 and the DSAT code in register 11 should continue to match to the same degree as they previously matched. As long as this matching condition is maintained then gates 12, register 13, counter 16 and comparator 17 will operate to provide a DSAT validity signal 7 which indicates that the received DSAT code is a valid DSAT code.

However, if noise corrupts the input signal 6A then, at some point, the number of errors in the received DSAT code may exceed the maximum number of allowable errors. In this case, DSAT validity signal 7 will indicate that the received DSAT code is not a valid DSAT code and controller 5 will respond by reentering the search mode and attempting to find a rotated reference DSAT code which matches the received DSAT code. If this matching condition can be reacquired then DSAT validity signal 7 will once again indicate that the received DSAT code is a valid DSAT code. If the received DSAT code does not match the reference DSAT code or any rotated reference DSAT code for more than 150 milliseconds then controller 5 will determine that the signal has been lost and will cause muting device 3 to mute the audio output of the mobile telephone. Once a valid DSAT code is received again then controller 5 will cause muting device 3 to pass the audio output from receiver 2.

From the above, it will be appreciated that the present invention provides a bit-by-bit comparison of a received DSAT code with a plurality of reference DSAT codes, including the valid DSAT code and the rotated DSAT codes, until a reference DSAT code is found which matches the received DSAT code within a certain number of bit errors. The comparison is made each time a new received DSAT code bit occurs, and the resulting received DSAT code may be compared with all reference DSAT codes to determine if a match occurs. Each received DSAT code may therefore be compared with all 24 reference DSAT codes, if that is necessary to obtain a match.

Register 13 and counter 16 serve to count the number of mismatches. Register 13 and counter 16 may be replaced, if desired, by hard-wired logic or a lookup table which performs the same function.

Figure 3:
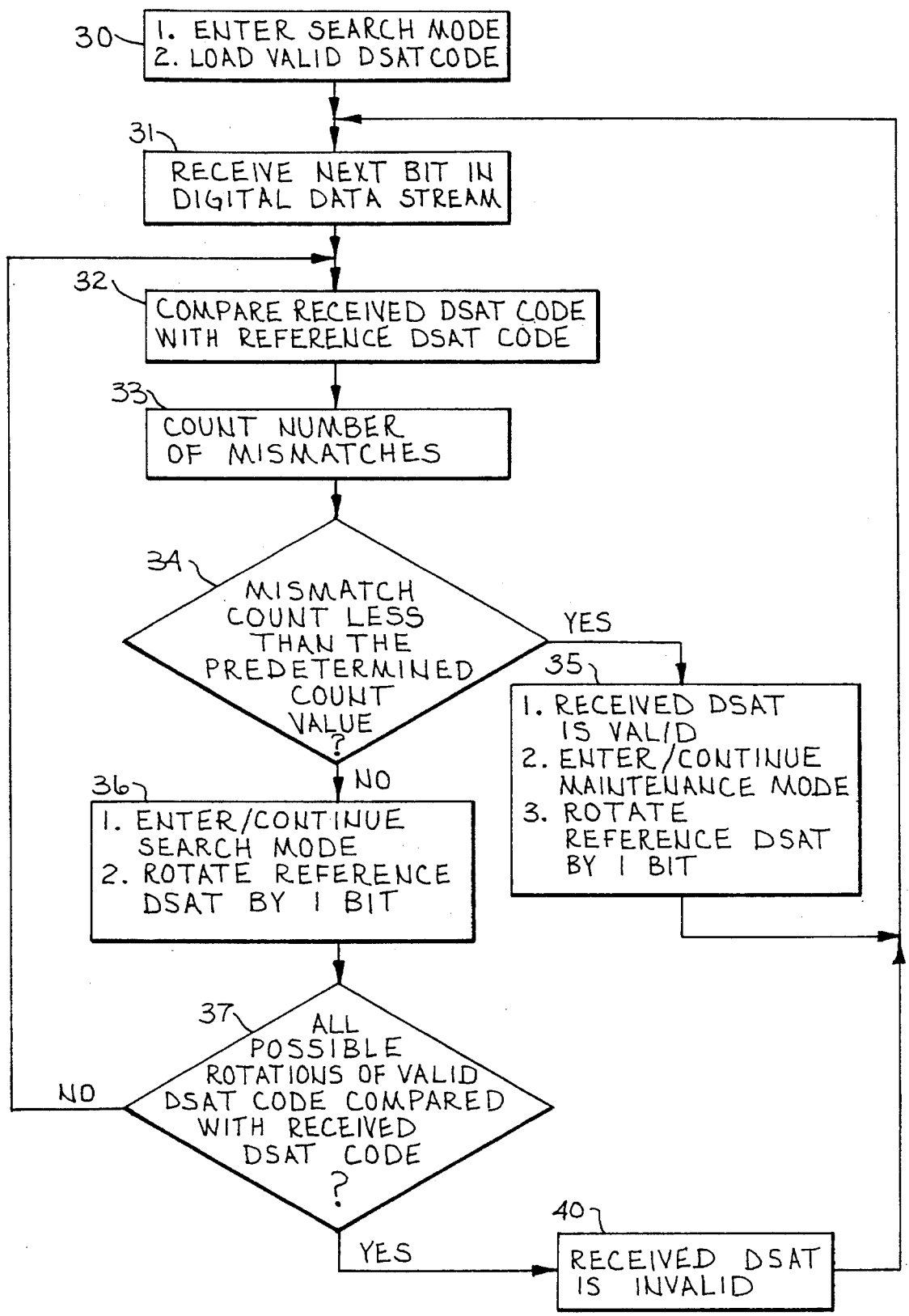
FIG. 3 is a flow chart of the DSAT detection process of the present invention.

Although the preferred embodiment of the present invention is in hardware, as described above, it will be appreciated that the DSAT detection process may also be accomplished in software. FIG. 3 is a flow chart of the DSAT detection process of the present invention. In step 30, the valid or reference DSAT code is loaded and the search mode is entered. In step 31 the next (or first) bit in the digital data stream is received to form a new received DSAT code. In step 32 the received DSAT code is compared with the reference DSAT code. In step 33 the number of mismatches between the received DSAT code and the reference DSAT code is counted. Decision 34 tests whether the actual number of mismatches is less than the maximum allowable number of mismatches. If not then in step 36 the search mode is re-entered or continued and the valid DSAT code is rotated by 1 bit. In decision 37 a determination is made as to whether all possible rotations of the reference DSAT code have been compared with the received DSAT code. If not then a return is made to step 32. If so then the received DSAT code is declared to be invalid and a return is made to step 31.

If, at decision 34, the number of mismatches was less than the allowable number of mismatches then, in step 35, the maintenance mode is entered, the received DSAT code is declared to be a valid DSAT code, and the reference DSAT code is rotated by 1 bit to synchronize with the received DSAT code when the next received bit is input.

In the preferred embodiment, the received DSAT code is declared to be a valid DSAT code if there are no more than three differences between the received DSAT code and the reference DSAT code. Three mismatched bits out of a total of 24 bits indicates an error rate of 12.5%, which is acceptable. A smaller number of mismatched bits could cause excessive muting of the audio output and excessive channel searching when even a moderate noise level is present. A greater number of allowable mismatches could excessively delay the muting action or prevent muting in the case where control information matches a valid DSAT code within a certain number of bits.

Because three mismatched bits are acceptable, it should be noted that, if the received DSAT code has no errors, the DSAT detector of the present invention can declare the received DSAT code to be a valid DSAT code even if only 21 bits have been received. This arises because, if the first 21 bits received match the first 21 bits of a reference DSAT code then the remaining three bits, whether matching or not, cannot cause the number of mismatches to be greater than three, and so the received DSAT code will be declared to be valid. Therefore, under optimum conditions, a valid received DSAT code may be detected within as little as 21 bit times, or 105 milliseconds.

Although the preferred implementation of the present invention is to compare the received DSAT code against the reference DSAT codes, it should be appreciated that it is also possible to compare the valid DSAT code against the 24 possible rotations of the received DSAT code. For example, referring to FIG. 2, it would only be necessary to load the valid DSAT code into register 11 and it would not be necessary to shift the code in register 11. With respect to register 10, the Q24 output of register 10 and the input data digital stream signal 6A would be routed through a selector switch to the serial input of register 10. When a new bit was received the selector switch would allow the new bit to be shifted into register 10. Then, the selector switch would be changed so as to route the Q24 output of register 10 back into the serial input of register 10 and the received DSAT code would then be right circular shifted (rotated) 24 times, so that each rotated received DSAT code would be compared with the valid DSAT code. The 24 shifts provide a full circular rotation of the received DSAT code so that, at the end of the rotations, the received DSAT code in register 10 is in the proper position for the next incoming bit from input digital data stream 6A. The operation of components 12–17 remains as previously described. The selector switch would be controlled by controller 5.

It is likewise possible to modify FIG. 3 so that a valid DSAT code is compared against rotated versions of the received DSAT code instead of comparing the received DSAT code against rotated versions of the valid DSAT code.

Figure 4:
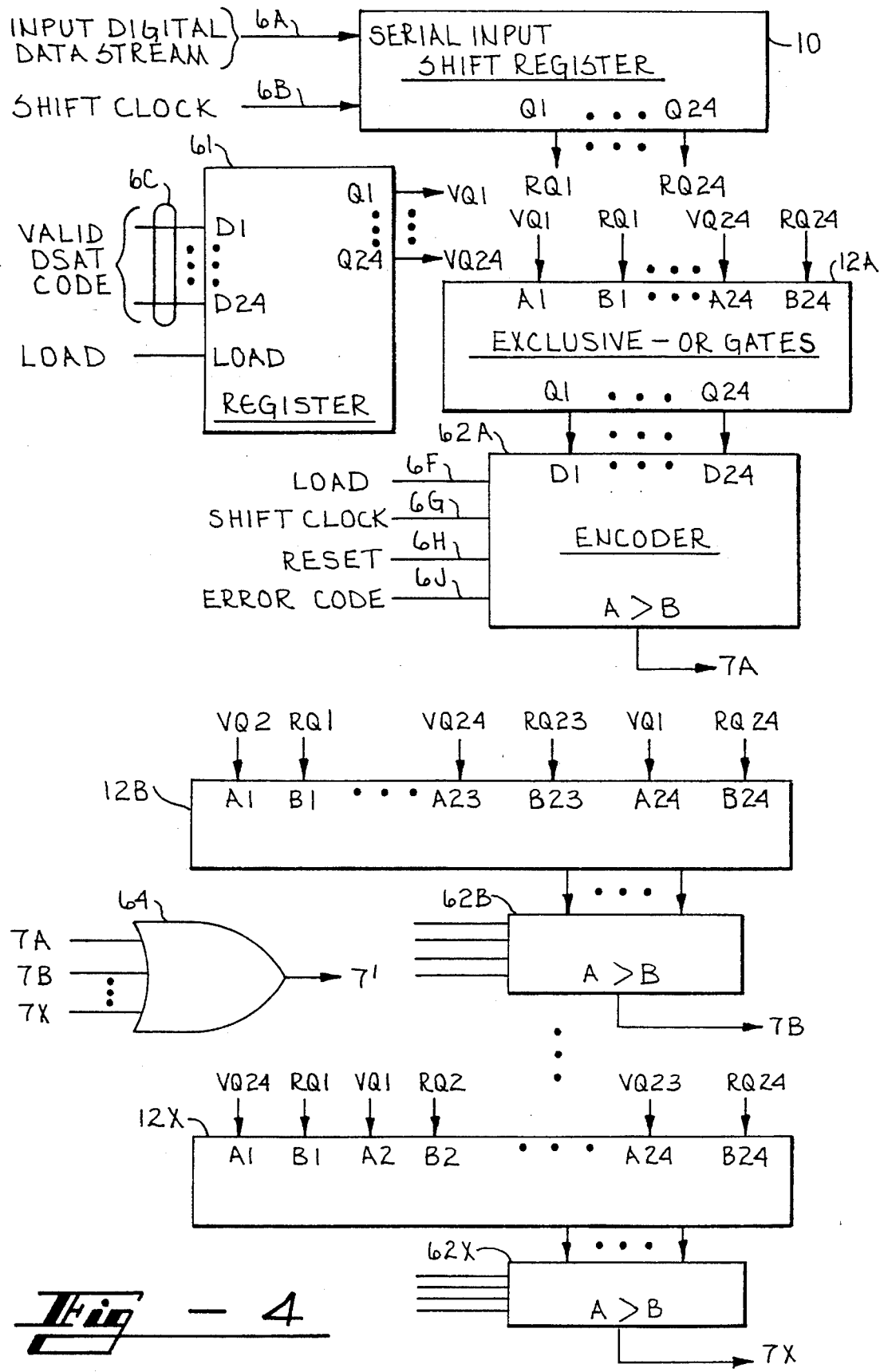
FIG. 4 is an alternative embodiment of the present invention.

FIG. 4 is an alternative embodiment of the present invention. This embodiment is hardware oriented and requires a substantial number of gates and logic but is substantially faster and reduces the requirements on the controller 5. In particular, in this embodiment controller 5 is only required to load the valid DSAT code once, and is not required to rotate the valid DSAT code. Register 10 of FIG. 4 functions in the same manner as register 10 of FIG. 2. That is, register 10 receives and then fight shifts the incoming received DSAT code as each new bit is received. The Q1–Q24 outputs of register 10, for clarity, are designated as signals RQ1–RQ24. Signals RQ1–RQ24 are provided to the B1–B24 inputs, respectively, of a set of 24 exclusive-OR gates 12A. As in FIG. 1, controller 5 provides a 24 bit valid or referenced DSAT code. This DSAT code is provided to the D1–D24 inputs of register 61 and controller 5 sends a load signal 6D to register 61 to cause register 61 to load the valid DSAT code signal 6C. The valid DSAT code signal then appears at outputs Q1–Q24 of register 61. For clarity, outputs Q1–Q24 of register 61 are shown as signals VQ1–VQ24, respectively. Signals VQ1–VQ24 are connected to the A1–A24 inputs, respectively, of gates 12A. Gates 12A, like gates 12 in FIG. 1, compare the received DSAT signal in register 10 with the referenced DSAT signal in register 61 on a bit-by-bit basis and provide a 24 bit comparison signal as outputs Q1–Q24 of gates 12A. The Q1–Q24 outputs of gates 12A are provided to the D1–D24 inputs, respectively, of a 24 bit parallel-to-5 bit encoder 62A, which may be conveniently implemented by components 13–17 and signals 6F–6J, as shown in FIG. 2, or may be conveniently implemented by hard-wired logic or a truth table. The output of encoder 62A is validity signal 7A which indicates whether the received DSAT code matches the valid DSAT code.

A second set of exclusive-OR gates 12B compares the received DSAT code with a rotated version of the valid DSAT code. However, the valid DSAT code is not actually rotated in register 61. In this implementation, the connections to the inputs of gates 12 are shifted so as to simulate rotation of the valid DSAT code. In particular, inputs A1–A23 are connected to outputs VQ2–VQ24, respectively, and input A24 is connected to output VQ1. Inputs B1–B24 are connected to the RQ1–RQ24 outputs, respectively, of register 10. Register 12B therefore provides a comparison of the received DSAT code with one rotation of the valid DSAT code. The Q1–Q24 outputs of gates 12B are connected to the D1–D24 input, respectively, encoder 62B. The output of encoder 62B is validity signal 7B.

For convenience, gates 12C–12W and encoders 62C–62W are not shown.

Register 12X and encoder 62X provide a comparison of the received DSAT signal with the 24th version of the valid DSAT code. Input A1 of gates 12X is connected to output VQ24 of register 61, and inputs A2–A24 of register 12X are connected to outputs VQ1–VQ23, respectively, of register 61. The B1–B24 inputs of gates 12X are connected to the RQ1–RQ24 outputs, respectively, of register 10. The Q1–Q24 outputs of register 12x are connected to the D1–D24 inputs, respectively, of encoder 62X. The output of encoder 62X is validity signal 7X. Validity signals 7A–7X are connected to the inputs of a 24-input OR gate 64. The output of gate 64 is validity signal 7'. If the received DSAT code matches any one of the rotated versions of the valid DSAT code within 3 bits then one of signals 7A–7X will be a logic one and therefore validity signal 7' will be a logic one, indicating that the received DSAT code is valid. This implementation simultaneously compares the received DSAT code with the 24 possible rotations of the valid DSAT code.

One could, instead, connect the VQ1–VQ24 outputs of register 61 to the A1–A24 inputs, respectively, of gates 12A–12X, so that each of gates 12A–12X receive the same valid DSAT code, and then change the connections between the Q1–Q24 outputs of register 10 and the B1–B24 inputs of gates 12 so that the valid DSAT code is compared against all the rotations of the received DSAT code.

In the implementation of FIG. 4, controller 5 is only required to provide load signal 6F, the 24 shift clock pulses 6G, and the reset signal 6H, once for each received bit rather than 24 times, as in FIG. 2, for each received bit. Furthermore, if lookup tables are used for encoders 62, then controller 5 will not need to provide signals 6F–6H.

It will be appreciated from the above that the present invention describes a method and an apparatus for rapidly comparing a received DSAT code with a valid DSAT code, even when the location of the starting bit of the received DSAT code is not known. The present invention provides for a determination that a received DSAT code is valid even if there are a number of errors in the received DSAT code, the number of errors being up to three in the preferred embodiment. The present invention provides for rapid determination of the validity of a DSAT code so that, under optimum conditions, the received DSAT code may be declared valid when as few as 21 bits have been received.

Although the present invention has been described above with respect to the determination of the validity of a received DSAT code it will be appreciated that the present invention is not limited to DSAT codes. More particularly, the present invention may be used to quickly and accurately determine whether any two codes match within a predetermined number of errors (or similarities), regardless of whether one or both of the codes is rotated, and regardless of where the starting point in either code is located. The two codes may be a received code and a reference code, or may be two codes received at different points in time. The codes may also represent a pattern of data bits that has a particular meaning or signifies a particular event. Also, although the preferred embodiment uses right shifts and right circular shifts, it will be appreciated that this is merely a design choice and left shifting and left circular shifting may also be used.

From a reading of the foregoing disclosure, other embodiments of the present invention may suggest themselves to those of skill in the art. Therefore, the scope of the present invention is to be limited only by the claims below.

We claim:

1. An apparatus for selectively muting a radiotelephone by detecting a received Digital Supervisory Audio Tone (DSAT) code contained in an input data stream, comprising:

first means for providing a first code, said first code being a predetermined one of either said received DSAT code or a reference code;

second means for providing a plurality of codes, said plurality of codes comprising a second code and a rotated second code, said second code being the non-selected one of said received DSAT code and said reference code;

third means for comparing said first code with said plurality of codes to provide a comparison signal for each code of said plurality of codes;

fourth means responsive to said comparison signal for determining the number of differences between said first code and each code of said plurality of codes;

a comparator, responsive to said number of differences for any code of said plurality of codes being less than a predetermined value, for providing a validity signal for said received DSAT code; and means for muting said radiotelephone if said validity signal is not provided and for unmuting said radiotelephone if said validity signal is provided.

2. The apparatus of claim 1 wherein said first means provides a first Digital Supervisory Audio Tone (DSAT) code and said second means provides a second DSAT code.

3. The apparatus of claim 1 wherein said first means comprises a shift register for receiving said first code in a serial format and providing said first code in a parallel format.

4. The apparatus of claim 1 wherein said second means comprises a shift register for providing said rotated code by rotating said second code.

5. The apparatus of claim 1 wherein said second means comprises:

a shift register;

means for providing said second code to said shift register; and means for causing said shift register to rotate said second code;

whereby said shift register sequentially provides said second code and said rotated second code.

6. The apparatus of claim 1 wherein said third means comprises a plurality of exclusive-OR gates responsive to said first code and said plurality of codes for providing said comparison signal.

7. The apparatus of claim 1 and further comprising control means for causing said second means to provide a first one of said plurality of codes to said third means, for examining said validity signal, and, if said validity signal indicates that said first code does not match said first one of said plurality of codes then causing said second means to provide a second one of said plurality of codes to said third means.

8. The apparatus of claim 1 wherein said second code has N bits and wherein said second means provides N-1 rotated codes for said plurality of codes, and said apparatus further comprises control means for causing said second means to sequentially provide codes of said plurality of codes to said third means, for examining said validity signal each time a code is provided to said third means, and, if said validity signal indicates that said first code matches any code of said rotated codes then declaring said received DSAT code to be valid.

9. The apparatus of claim 1 wherein said third means sequentially compares said first code with each code of said plurality of codes.

10. The apparatus of claim 9 wherein said input data stream comprises a series of bits representing said received DSAT code and wherein said third means compares said first code with each code of said plurality of codes each time a bit in said series of bits is received.

11. The apparatus of claim 1 wherein said third means simultaneously compares said first code with each code of said plurality of codes.

12. The apparatus of claim 11 wherein said input data stream comprises a series of bits representing said received DSAT code and wherein said third means compares said first code with each code of said plurality of codes each time a bit in said series of bits is received.

13. The apparatus of claim 1 wherein said comparator is responsive to said number of differences being not greater than three, for any code of said plurality of codes, for providing said validity signal.

14. The apparatus of claim 1 wherein said third means begins comparing said first code with said plurality of codes before said input data stream has provided a complete said received DSAT code.

15. A method for selectively muting a radiotelephone by detecting a Digital Supervisory Audio Tone (DSAT) code contained in an input data stream, comprising the steps of:

providing a first code, said first code being a predetermined one of either said received DSAT code or a reference code;

providing a plurality of codes, said plurality of codes comprising a second code and a rotated second code, said second code being the non-selected one of said received DSAT code and said reference code;

comparing said first code with said plurality of codes to provide a comparison signal for each code of said plurality of codes;

evaluating said comparison signal to determine the number of differences between said first code and each code of said plurality of codes;

providing a validity signal for said received DSAT code when said number of differences between said first code and any code of said plurality of codes is less than a predetermined value; and muting said radiotelephone if said validity signal is not provided and unmuting said radiotelephone if said validity signal is provided.

16. The method of claim 15 wherein said first code is a Digital Supervisory Audio Tone (DSAT) code and said second code is a DSAT code.

17. The method of claim 15 wherein said step of providing said rotated code comprises rotating said second code.

18. The method of claim 15 wherein said step of comparing comprises sequentially comparing said first code with each code of said plurality of codes.

19. The method of claim 18 wherein said input data stream comprises a series of bits representing said received DSAT code and wherein said step of comparing said received DSAT code comprises comparing said first code with each code of said plurality of codes each time a bit in said series of bits is received.

20. The method of claim 15 wherein said step of comparing comprises simultaneously comparing said first code with each code of said plurality of codes.

21. The method of claim 20 wherein said input data stream comprises a series of bits representing said received DSAT code and wherein said step of comparing said received DSAT code comprises comparing said first code with each code of said plurality of codes each time a bit in said series of bits is received.

22. The method of claim 15 wherein said step of providing a validity signal comprises providing said validity signal for said received DSAT code when said number of differences between said first code and any code of said plurality of codes is not greater than three.

23. The method of claim 15 wherein said step of comparing begins before said input data stream has provided a complete said received DSAT code.

24. An apparatus for selectively muting a radiotelephone by detecting a received Digital Supervisory Audio Tone (DSAT) code contained in an input data stream, comprising:

a first register operative to provide a first code, said first code being a predetermined one of either said received DSAT code contained in an input data streat or a reference code;

a second register operative to provide a plurality of codes, said plurality of codes comprising a second code and a rotated second code, said second code being the non-selected one of said received DSAT code and said reference code;

a first comparator opertive to compare said first code with said plurality of codes to provide a comparison signal for each code of said plurality of codes;

a counter operative to provide a count signal indicative of the number of differences in said comparison signal for each code of said plurality of codes;

a second comparator operative to provide a validity signal for said received DSAT code in response to said count signal being less than a predetermined value for any code of said plurality of codes; and means for muting said radiotelephone if said validity signal is not provided and for unmuting said ratiotelephone if said validity signal is provided.

25. The apparatus of claim 24 wherein said first register provides a first Digital Supervisory Audio Tone (DSAT) code and said second register provides a second DSAT code.

26. The apparatus of claim 24 wherein said first register comprises a shift register operative to receive said first code in a serial format and to provide said first code in a parallel format.

27. The apparatus of claim 24 wherein said second register comprises a shift register operative to provide said rotated code by rotating said second code.

28. The apparatus of claim 24 wherein said second register comprises:

a shift register;

a controller operative to provide said second code to said shift register and to cause said shift register to rotate said second code;

whereby said shift register sequentially provides said second code and said rotated second code.

29. The apparatus of claim 24 wherein said first comparator comprises a plurality of exclusive-OR gates.

30. The apparatus of claim 24 and further comprising a controller operative to cause said second register to provide a first one of said plurality of codes to said first comparator, and further operative to examine said validity signal, and, if said validity signal indicates that said first code does not match said first one of said plurality of codes then said controller is further operative to cause said second register to provide a second one of said plurality of codes to said first comparator.

31. The apparatus of claim 24 wherein said second code has N bits and wherein said second register is operative to provide N-1 rotated codes for said plurality of codes, and said apparatus further comprises a controller operative to cause said second register to sequentially provide codes of said plurality of codes to said first comparator, and further operative to examine said validity signal each time a code is provided to said first comparator, and, if said validity signal indicates that said first code matches any code of said rotated codes then said controller declares said received code DSAT to be valid.

32. The apparatus of claim 24 wherein said first comparator is operative to sequentially compare said first code with each code of said plurality of codes.

33. The apparatus of claim 32 wherein said input data stream comprises a series of bits representing said received DSAT code and wherein said first comparator compares said first code with each code of said plurality of codes each time a bit in said series of bits is received.

34. The apparatus of claim 24 wherein said first comparator simultaneously compares said first code with each code of said plurality of codes.

35. The apparatus of claim 34 wherein said input data stream comprises a series of bits representing said received DSAT code and wherein said first comparator compares said first code with each code of said plurality of codes each time a bit in said series of bits is received.

36. The apparatus of claim 24 wherein said second comparator provides said validity signal for said received DSAT code in response to said count signal being not greater than three.

37. The apparatus of claim 24 wherein said first comparator begins comparing said first code with said plurality of codes before said input data stream has provided a complete said received DSAT code.

* * * * *